United States Patent
Chen et al.

(10) Patent No.: US 6,232,172 B1
(45) Date of Patent: May 15, 2001

(54) METHOD TO PREVENT AUTO-DOPING INDUCED THRESHOLD VOLTAGE SHIFT

(75) Inventors: Sen-Fu Chen, Taipei; Yuan-Ko Hwang, Hualien; Huan-Wen Wang, Hsin Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/354,673

(22) Filed: Jul. 16, 1999

(51) Int. Cl.[7] ............ H01L 21/8242; H01L 21/336; H01L 21/335; H01L 21/8238; H01L 21/8232

(52) U.S. Cl. .......... 438/251; 438/301; 438/291; 438/143; 438/217; 438/916

(58) Field of Search .................. 438/251, 301, 438/291, 217, 299, 916, 238, 143

(56) References Cited

U.S. PATENT DOCUMENTS

| | | | |
|---|---|---|---|
| 4,753,895 | 6/1988 | Mayer et al. | 437/21 |
| 4,894,349 | 1/1990 | Saito et al. | 437/95 |
| 4,925,809 | * 5/1990 | Yoshiharu et al. | 437/95 |
| 5,024,962 | * 6/1991 | Murray et al. | 437/40 |
| 5,070,382 | 12/1991 | Cambou | 357/48 |
| 5,492,868 | 2/1996 | Lin et al. | 437/228 |
| 5,538,906 | * 7/1996 | Aoki | 437/29 |
| 5,648,282 | 7/1997 | Yoneda | 437/40 |

* cited by examiner

*Primary Examiner*—Wael Fahmy
*Assistant Examiner*—Neal Berezny
(74) *Attorney, Agent, or Firm*—George O. Saile; Stephen B. Ackerman; Rosemary L. S. Pike

(57) ABSTRACT

A method to prevent threshold shifts in MOS transistors due to auto-doping from heavily doped polysilicon layers. Isolation regions are provided in a semiconductor substrate separating active areas. A gate oxide layer is formed over the surface of the semiconductor substrate. A polysilicon layer is deposited overlying the gate oxide layer. A tungsten silicide layer is deposited overlying the polysilicon layer. The tungsten silicide layer and the first polysilicon layer are etched to form MOS gates and bottom electrodes for dual polysilicon capacitors. An interpoly dielectric layer is deposited overlying entire surface of the semiconductor substrate. A doped polysilicon layer is deposited overlying the interpoly dielectric layer. A sealing oxide layer is deposited overlying the doped polysilicon layer to prevent out-diffusion of impurity ions into the semiconductor substrate and thereby preventing auto-doping. The tungsten silicide layer is annealed. Ions are implanted to form drain and source regions. The fabrication of the integrated circuit device is completed.

20 Claims, 3 Drawing Sheets

METHOD TO PREVENT AUTO-DOPING INDUCED THRESHOLD VOLTAGE SHIFT

BACKGROUND OF THE INVENTION (1) Field of the Invention

The present invention relates to the fabrication of semiconductor structures, and more particularly, to a method of preventing auto-doping from the top polysilicon layer and the wafer backside in the manufacture of integrated circuits.

(2) Description of the Prior Art

Threshold voltage ($V_t$) is one of the most critical parameters in a CMOS transistor. Maintaining a uniform $V_t$ is critical to proper device performance. The deliberate implantation of dopant species into active areas in the silicon substrate to adjust the transistor $V_t$ is standard practice in the manufacture of semiconductors. However, these active areas can also be unintentionally doped, in a process called auto-doping.

Auto-doping of an integrated circuit can occur whenever both highly doped regions and non-doped or lesser-doped regions are exposed during a high temperature processing step. Dopant from the highly doped regions will tend to out-gas into the thermal chamber and then re-diffuse into the non-doped or lesser-doped regions on the substrate. Of particular concern in the present invention is the problem of auto-doping of the active areas of planned CMOS transistors due to the movement of ions from heavily doped polysilicon structures to these active areas.

FIG. 1 illustrates the auto-doping problem in the prior art. A capacitor 24 has been fabricated overlying a field oxide region 12 on a semiconductor substrate 10 that is doped n-type. The capacitor comprises a polysilicon bottom electrode 14, a tungsten silicide ($Wsi_x$) layer 16, a dielectric layer 18, and a highly doped top polysilicon electrode 20. Also shown is the gate structure 22 for a partially completed PMOS transistor.

During a thermal cycle event, such as the anneal of the tungsten silicide layer to reduce its resistivity, phosphorous dopant 26 from the top capacitor electrode 20 out-diffuses into the thermal chamber atmosphere. The phosphorous dopant 26 then diffuses into the substrate where the surfaces of the source and drain regions 28 of the planned PMOS transistor are exposed. The phosphorous will then laterally and vertically diffuse and increase the n-type dopant concentration near or under the edge of the channel region. Because of the higher concentration of n-type dopant near the channel region, a higher gate voltage will have to be applied to invert the channel region in order to form a conductive channel from source to drain. This is the negative consequence of auto-doping.

The auto-doping problem is made even worse if the upper polysilicon layer is deposited using a diffusion deposition technique where the phosphorous is insitu doped during the polysilicon deposition. In this case, heavily doped polysilicon will cover the backside of the semiconductor wafer. In a subsequent thermal cycle event, such as the aforementioned tungsten silicide anneal, this polysilicon acts a major source for phosphorous out-gassing and, therefore, potential auto-doping effects.

Several prior art approaches attempt to reduce various auto-doping problems. U.S. Pat. No. 4,753,895 to Mayer et al teaches a method to reduce auto-doping of aluminum from a sapphire ($Al_2O_3$) dielectric into semiconductor islands during an annealing step in a semiconductor on sapphire process. Ion implantation depths specific to p-channel and n-channel devices are disclosed. U.S. Pat. No. 5,492,868 to Lin et al teaches a method of forming an oxide capping layer over the entire surface before BPSG reflow to prevent auto-doping of source, drain, and gate contact areas. U.S. Pat. No. 5,024,962 to Murray et al teaches a sealing oxide layer formed over the substrate, prior to the deposition of the polysilicon gate layer, to prevent auto-doping from source, drain, and backside regions into exposed channel regions. U.S. Pat. No. 5,648,282 to Yoneda teaches a method to thermally grow a 5 nanometer layer of oxide overlying the surface of the wafer, including overlying any doped polysilicon on both the front and backside of the wafer, to prevent auto-doping during subsequent thermal processing. This layer of oxide is grown after the definition of the polysilicon gates and the implantation of the lightly doped drains. U.S. Pat. No. 4,894,349 to Saito et al teaches an auto-doping prevention technique for epitaxial layers where a first-stage epitaxial layer is grown undoped and a second-stage epitaxial layer is grown doped as desired. U.S. Pat. No. 5,070,382 to Cambou et al teaches an auto-doping prevention for epitaxial layers where a second epitaxial layer is grown with higher resistivity to reduce auto-doping to a third epitaxial layer. Finally, co-pending U.S. patent application Ser. No. 09/058,127 to C.F. Chen et al filed on Apr. 10, 1998, discloses a dual layer polysilicon deposition where an undoped polysilicon is deposited over a doped polysilicon to prevent auto-doping.

SUMMARY OF THE INVENTION

A principal object of the present invention is to provide an effective and very manufacturable method of fabricating integrated circuits in which out-diffusion of dopant from polysilicon layers is prevented.

A further object of the present invention is to provide an effective and very manufacturable method for fabricating integrated circuits in which out-diffusion of dopant from the polysilicon layer is prevented by fabricating a sealing oxide layer over the polysilicon layer.

Another object of the present invention is to provide a manufacturing method for fabricating integrated circuits in which auto-doping of transistor active regions is prevented.

Another object of the present invention is to provide a manufacturing method for fabricating dual polysilicon capacitors in which auto-doping of transistor active regions is prevented.

In accordance with the objects of this invention, a new method of fabricating an integrated circuit in which a sealing oxide layer is provided which eliminates out-diffusion of dopant from the polysilicon so that there is no auto-doping of transistor active regions is achieved. Field oxide isolation regions are provided to define active and non-active device regions on a semiconductor substrate. A layer of gate oxide is provided overlying the surface of the substrate. A polysilicon layer is deposited overlying the gate oxide layer. A layer of tungsten silicide is deposited overlying the polysilicon layer. The tungsten silicide layer, polysilicon layer, and gate oxide layer are etched away where they are not covered by a mask to provide gate electrodes for MOS devices, bottom plate electrodes for capacitors, and any other desirable features or connectivity. An interpoly dielectric layer is deposited overlying the surface of the wafer. A doped polysilicon layer is deposited overlying the interpoly dielectric layer. A sealing oxide layer is formed overlying the doped polysilicon layer on both the frontside and backside of the wafer to eliminate out diffusion of impurity ions from the doped polysilicon. The sealing oxide layer, the doped polysilicon layer and the interpoly dielectric layer are etched away where they are not covered by a mask to leave the sealing oxide layer, the doped polysilicon layer and the interpoly dielectric layer where needed for specific features or connectivity. Where the sealing oxide layer, the doped polysilicon layer and the interpoly dielectric are left overlying the capacitor bottom plate electrode, the doped polysilicon layer becomes the top plate electrode of a capacitor. The tungsten silicide layer is annealed to improve resistivity. During the anneal, the sealing oxide layer overlying the doped polysilicon layer prevents out-diffusion of dopant from the doped polysilicon layer, and therefore, auto-doping of the active regions of transistors is prevented. Ion implants are performed to form source and drain regions for MOS devices. An interlevel dielectric is deposited overlying the surface of the substrate. Contact holes for MOS gates, sources, and drains, capacitors, as well as other connective features, are etched in the interlevel dielectric. A metal layer is deposited overlying the interlevel dielectric and filling the contact holes. The metal layer is etched to define connectivity. A passivation layer is deposited overlying the metal layer and the interlevel dielectric. The integrated circuit is completed.

BRIEF DESCRIPTION OF THE DRAWINGS

In the accompanying drawings forming a material part of this description, there is shown.

DESCRIPTION OF THE PREFERRED EMBODIMENTS

Figure 1:
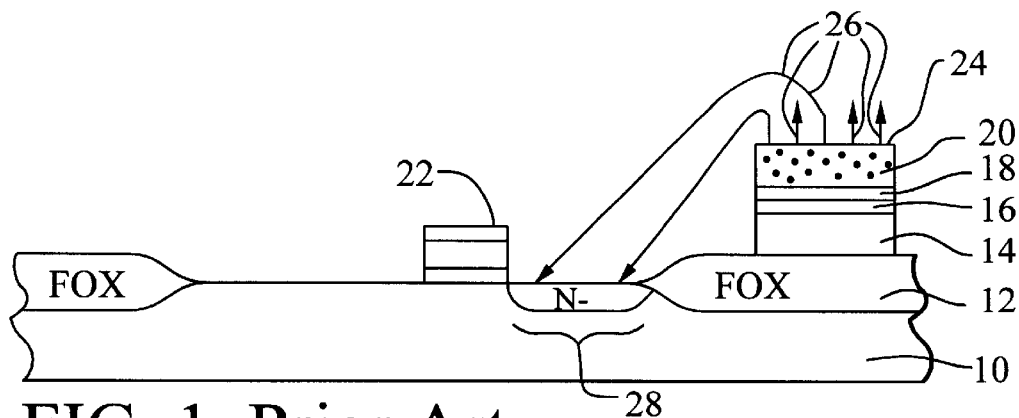
FIG. 1 schematically illustrates in cross-section a partially completed prior art integrated circuit showing the auto-doping effect of out-gassing of dopant from a dual polysilicon capacitor plate into the active region of a PMOS transistor.
Figure 2:
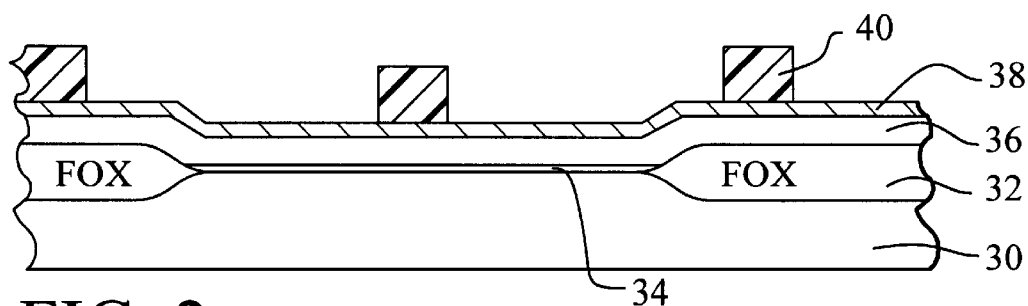
FIGS. 2 through 9 schematically illustrate in cross-sectional representation a preferred embodiment of the present invention.

Referring now more particularly to FIG. 2, there is illustrated a portion of a partially completed integrated circuit. Semiconductor substrate 30 is preferably composed of monocrystalline silicon. Isolation regions 32 have been formed in the substrate 30 to isolate active device areas. The isolation regions are shown preferably formed by the growth of thick field oxide, which is conventional in the art.

The surface of the substrate 30 is thermally oxidized to form the desired gate oxide layer 34 thickness that is between about 4000 Angstroms and 5000 Angstroms. Alternatively, the gate oxide layer 34 may be deposited over the surface of the substrate. The polysilicon layer 36 is blanket deposited, for example, by diffusion deposition in a furnace operation to a thickness of between about 1000 Angstroms and 1500 Angstroms. A tungsten silicide layer 38 is then deposited overlying the polysilicon layer to a thickness of between about 1000Angstroms and 1500 Angstroms.

Figure 3:
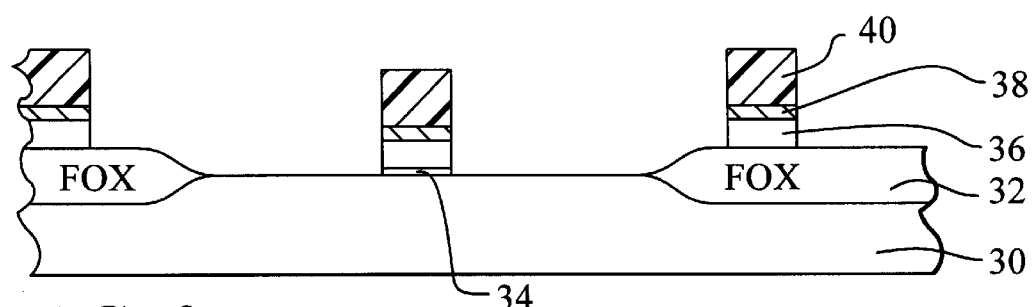

A photoresist mask 40 is deposited and patterned overlying the surface of the tungsten silicide layer 38. The tungsten silicide layer 38, polysilicon layer 36, and gate oxide layer 34 are patterned and etched using conventional photolithography to form desired features such as MOS gate electrodes, capacitor bottom plate electrodes, and connectivity traces as shown in FIG. 3.

Figure 4:
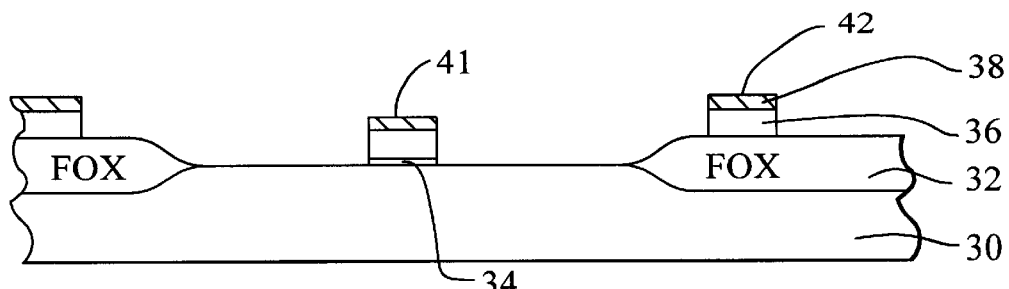

Referring now to FIG. 4, the photoresist mask 40 is removed. A completed PMOS gate electrode 41 and the polycide lines 42 that will form the bottom plates of the capacitors are illustrated.

Figure 5:
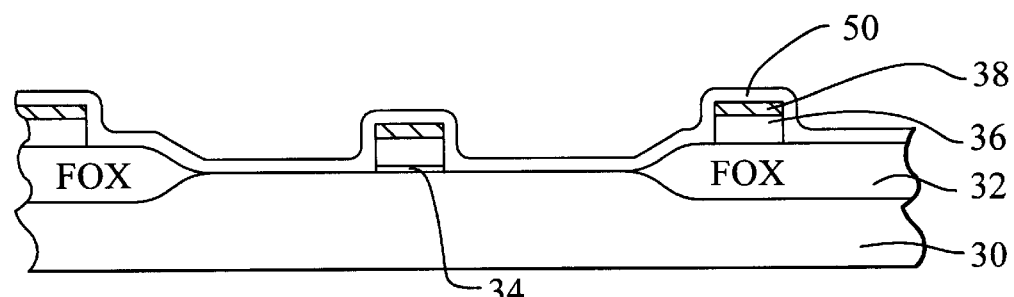

Referring now to FIG. 5, an interpoly dielectric layer 50, consisting preferably of silicon oxide-silicon nitride-silicon oxide (ONO) is formed overlying the surface of the substrate to a thickness of between about 200 Angstroms and 400 Angstroms.

Figure 6:
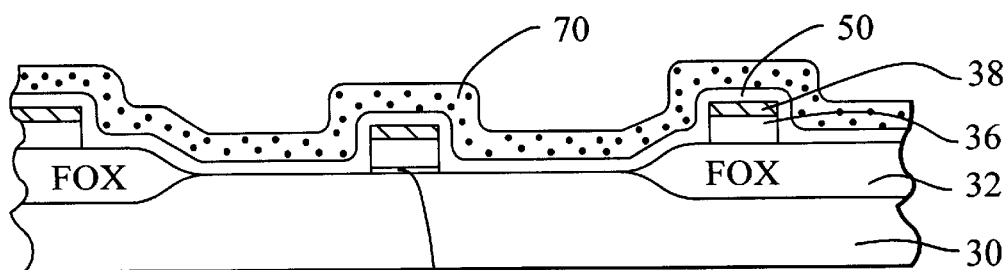

Referring now to FIG. 6, a doped polysilicon layer 70 is deposited overlying the interpoly dielectric layer 50. This doped polysilicon layer 70 would preferably be deposited by diffusion deposition to a thickness of between about 2000 Angstroms and 3000 Angstroms. The doped polysilicon layer 70 is in-situ doped to a concentration of between about $1\times10^{19}$ atoms/cm$^3$ and $1\times10^{20}$ atoms/cm$^3$. The doped polysilicon layer 70 could also be deposited undoped and then ion implanted to the desired concentration.

Figure 7:
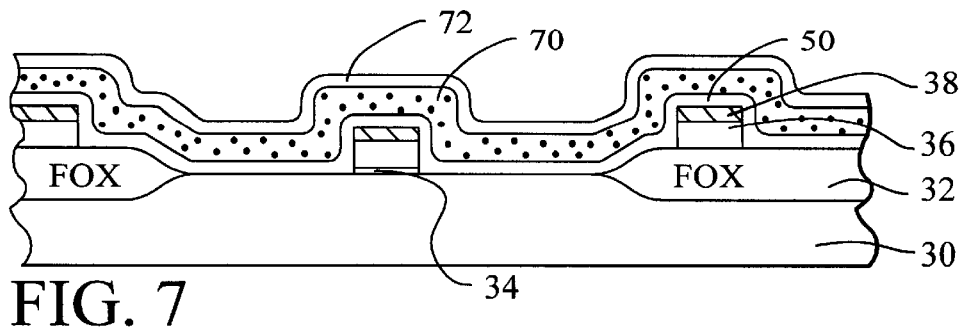

Referring to FIG. 7, an important feature of the present invention is illustrated. A novel oxide seal is used to prevent auto-doping. The novel sealing oxide layer 72 is formed overlying the doped polysilicon layer 70 on both the frontside and backside of the wafer. This sealing oxide 72 must be formed thick enough to prevent the out diffusion of dopant from the doped polysilicon 70 during subsequent thermal processing. In practice, this sealing oxide layer 72 is formed to a thickness of between 50 Angstroms and 100 Angstroms.

Note that this sealing oxide layer 72 must be formed on both the frontside and backside of the wafer. This is because the doped polysilicon layer 70 is deposited on both the frontside and backside of the wafer. Therefore, out diffusion of dopant could occur from the backside as well as the frontside. In practice, since none of the backside polysilicon is etched away during gate electrode definition, the amount of auto-doping caused by doped polysilicon on the backside of the wafer can actually be greater than that caused from doped polysilicon on the frontside of the wafer.

Note also that this novel sealing oxide layer 72 of the present invention must be formed after the deposition of the doped polysilicon layer 70 but before any other high temperature processing steps. In the preferred embodiment, this means that the sealing oxide layer 72 is formed before the subsequent tungsten silicide anneal operation and the source/drain implants that follow this anneal.

The sealing oxide layer 72 can be formed in at least two ways. First, the sealing oxide can be deposited by diffusion. A layer of silicon oxide is thus deposited overlying the doped polysilicon layer 70 in a diffusion chamber to form the sealing oxide layer 72. Second, the sealing oxide layer 72 can be formed by adding a thermal step right after the doped polysilicon deposition. Herein a layer of silicon oxide is grown on the surface of the doped polysilicon layer 70 in the same chamber as polysilicon deposition.

Figure 8:
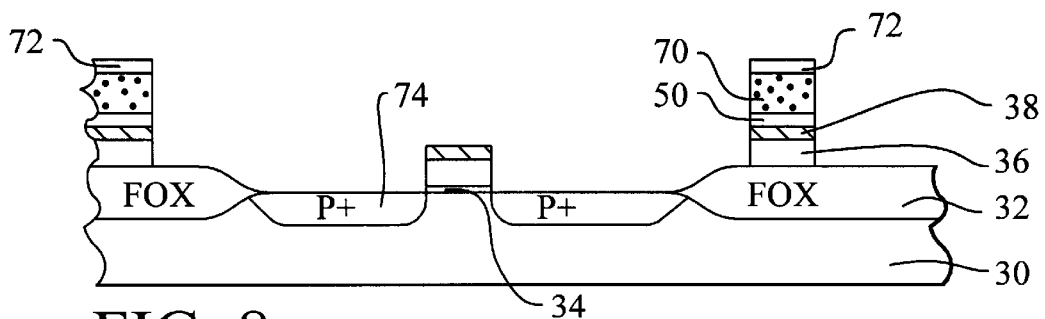

Referring now to FIG. 8, the sealing oxide layer 72, the doped polysilicon layer 70 and the interpoly dielectric layer 50 are now etched away by a conventional photolithography and etch sequence to form the dual polysilicon capacitor stack shown as well as other features and connectivity.

The aforementioned high temperature anneal of the tungsten silicide layer 38 is now performed at a temperature of between about 890 degrees C and 910 degrees C for between about 29 minutes and 31 minutes. The purpose of this annealing step is to reduce the resistivity of the tungsten silicide layer 38. In the present invention, the sealing oxide layer 72 stops out-gassing of the dopant in the doped polysilicon layer 70 during this and subsequent thermal processing steps. This stops auto-doping of the substrate from occurring.

After the tungsten silicide anneal, ions are implanted into the semiconductor substrate 30 to form source and drain regions 74 as is conventional in the art.

Figure 9:
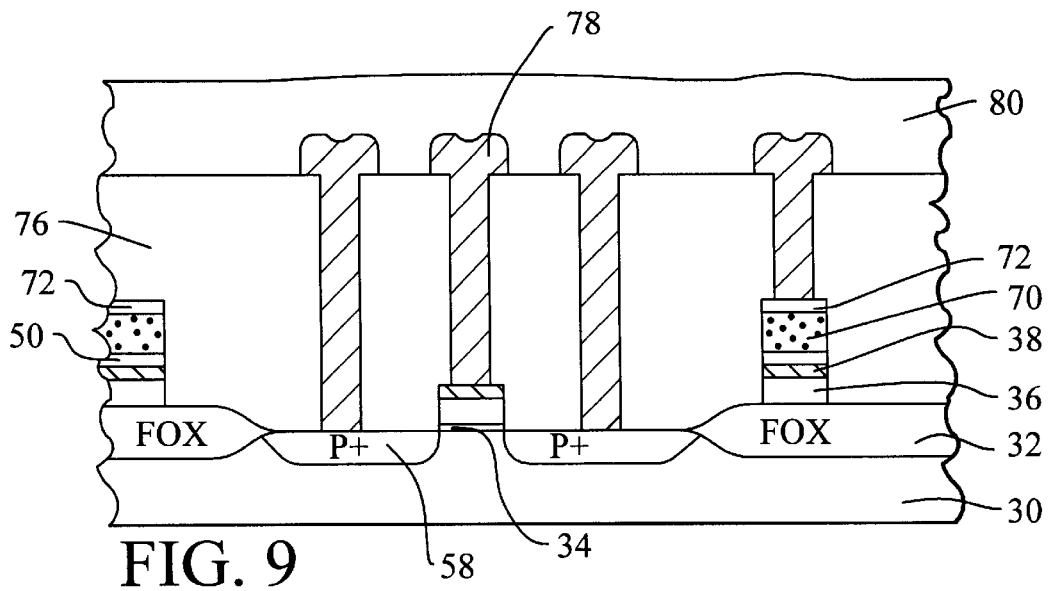

Processing continues as is conventional in the art to complete the integrated circuit device. For example, as shown in FIG. 9, an interlevel dielectric layer 76, composed of borophosphosilicate glass (BPSG), is blanket deposited over the surface of the substrate. Contact openings are etched through the interlevel dielectric 76. A metal layer 78 is deposited overlying the interlevel dielectric and filling the contact openings. The metal layer 78 is etched to make connections to transistor nodes, capacitor nodes, and other features. A passivation layer 80 is deposited to complete the integrated circuit device.

The process of the present invention provides a very manufacturable process for preventing auto-doping induced threshold shifting due to dopant out-diffusion of doped polysilicon. The application of the novel sealing oxide after the deposition of the doped polysilicon and before the anneal of tungsten silicide and formation of sources and drains eliminates auto-doping of the substrate due to the doped polysilicon existing on both the frontside and backside of the wafer.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of an integrated circuit device comprising:
    providing isolation regions and active areas in a semiconductor substrate;
    forming a gate oxide layer over the surface of said semiconductor substrate;
    depositing a polysilicon layer overlying said gate oxide layer;
    depositing a tungsten silicide layer overlying said polysilicon layer;
    etching said tungsten silicide layer and said polysilicon layer to form MOS gates and bottom electrodes for dual polysilicon capacitors;
    depositing an interpoly dielectric layer overlying entire surface of said semiconductor substrate;
    depositing a doped polysilicon layer overlying said interlevel dielectric layer;
    forming a sealing oxide layer by diffusion overlying said doped polysilicon layer on both frontside and backside of said semiconductor substrate;
    thereafter patterning said sealing oxide layer, said doped polysilicon layer and said interlevel dielectric layer on said frontside of said semiconductor substrate to form top electrodes for dual polysilicon capacitors wherein said sealing oxide layer remains overlying said backside of said semiconductor substrate;
    thereafter annealing said tungsten silicide layer whereby auto-doping from said doped polysilicon layer is prevented by the presence of said sealing oxide layer;
    thereafter implanting ions into said semiconductor substrate to form source and drain regions in said semiconductor substrate;
    depositing an interlevel dielectric layer overlying entire surface of said semiconductor substrate;
    etching through said interlevel dielectric layer to form contact holes;
    depositing metal overlying said interlevel dielectric layer and filling said contact holes;
    etching said metal to form conductive traces;
    depositing a passivation layer overlying said metal layer and said interlevel dielectric layer to complete the fabrication of said integrated circuit device.

2. The method according to claim 1 wherein said doped polysilicon layer is deposited to a thickness of between about 2000 Angstrom and 3000 Angstroms.

3. The method according to claim 1 wherein said doped polysilicon layer is in-situ doped during deposition to a concentration of between about $1 \times 10^{19}$ atoms/cm$^3$ and $1 \times 10^{20}$ atoms/cm$^3$.

4. The method according to claim 1 wherein said doped polysilicon layer is ion implanted following deposition to a concentration of between about $1 \times 10^9$ atoms/cm$^3$ and $1 \times 10^{20}$ atoms/cm$^3$.

5. The method according to claim 1 wherein said tungsten silicide layer is annealed at a temperature of between about 890 degrees C and 910 degrees C For between about 29 minutes and 31 minutes.

6. The method according to claim 1 wherein said interpoly dielectric layer is deposited to a thickness of between about 200 Angstroms and 400 Angstroms.

7. The method according to claim 1 wherein said sealing oxide layer is formed to a thickness of between about 50 Angstroms and 100 Angstroms.

8. A method of fabrication of an integrated circuit device comprising:
    providing isolation regions and active areas in a semiconductor substrate;
    forming a gate oxide layer over the surface of said semiconductor substrate;
    depositing a polysilicon layer overlying said gate oxide layer;
    depositing a tungsten silicide layer overlying said polysilicon layer;
    etching said tungsten silicide layer and said polysilicon layer to form MOS gates and bottom electrodes for dual polysilicon capacitors;
    depositing an interpoly dielectric layer overlying entire surface of said semiconductor substrate;
    depositing a doped polysilicon layer overlying said interlevel dielectric layer;
    growing a sealing oxide layer by a thermal oxidation process overlying said doped polysilicon layer on both frontside and backside of said semiconductor substrate;
    thereafter patterning said sealing oxide layer, said doped polysilicon layer and said interlevel dielectric layer to form top electrodes for dual polysilicon capacitors wherein said sealing oxide layer remains overlying said backside of said semiconductor substrate;
    thereafter annealing said tungsten silicide layer whereby auto-doping from said doped polysilicon layer is prevented by the presence of said sealing oxide layer;
    thereafter implanting ions into said semiconductor substrate to form source and drain regions in said semiconductor substrate;
    depositing an interlevel dielectric layer overlying entire surface of said semiconductor substrate;
    etching through said interlevel dielectric layer to form contact holes;
    depositing metal overlying said interlevel dielectric layer and filling said contact holes;
    etching said metal to form conductive traces;
    depositing a passivation layer overlying said metal layer and said interlevel dielectric layer to complete the fabrication of said integrated circuit device.

9. The method according to claim 8 wherein said doped polysilicon layer is deposited to a thickness of between about 2000 Angstroms and 3000 Angstroms.

10. The method according to claim 8 wherein said doped polysilicon layer is in-situ doped during deposition to a concentration of between about $1\times10^9$ atoms/cm$^3$ and $1\times10^{20}$ atoms/cm$^3$.

11. The method according to claim 8 wherein said doped polysilicon layer is ion implanted following deposition to a concentration of between about $1\times10^9$ atoms/cm$^3$ and $1\times10^{20}$ atoms/cm$^3$.

12. The method according to claim 8 wherein said tungsten silicide layer is annealed at a temperature of between about 890 degrees C and 910 degrees C for between about 29 minutes and 31 minutes.

13. The method according to claim 8 wherein said interpoly dielectric layer is deposited to a thickness of between about 200 Angstroms and 400 Angstroms.

14. The method according to claim 8 wherein said sealing oxide layer is grown to a thickness of between about 50 Angstroms and 100 Angstroms.

15. A method of fabrication of a dual polysilicon capacitor device comprising:

providing isolation regions in a semiconductor substrate;

depositing a polysilicon layer overlying said semiconductor substrate;

depositing a tungsten silicide layer overlying said polysilicon layer;

etching said polysilicon layer and said tungsten silicide layer to form bottom electrodes for dual polysilicon capacitors;

depositing an interpoly dielectric layer overlying entire surface of said semiconductor substrate;

depositing a doped polysilicon layer overlying said interlevel dielectric layer wherein said doped polysilicon layer is deposited having a concentration of between about $1\times10^9$ atoms/cm$^3$ and $1\times10^{20}$ atoms/cm$^3$;

thereafter forming a sealing oxide overlying said doped polysilicon layer on both frontside and backside of said semiconductor substrate;

thereafter annealing said tungsten silicide layer whereby auto-doping from said doped polysilicon layer is prevented by the presence of said sealing oxide layer; and thereafter patterning said sealing oxide layer, said doped polysilicon layer and said interlevel dielectric layer to form top electrodes for dual polysilicon capacitors and thereby completing said dual polysilicon capacitor device wherein said sealing oxide layer remains overlying said backside of said semiconductor substrate.

16. The method according to claim 15 wherein said step of forming said sealing oxide layer is by depositing said sealing oxide layer using a diffusion process.

17. The method according to claim 16 wherein said step of forming said sealing oxide layer is by thermal oxidation of said doped polysilicon layer.

18. The method according to claim 16 wherein said doped polysilicon layer is deposited to a thickness of between about 2000 Angstroms and 3000 Angstroms.

19. The method according to claim 15 wherein said sealing oxide layer is formed to a thickness of between about 50 Angstroms and 100 Angstroms.

20. The method according to claim 15 wherein said tungsten silicide layer is annealed at a temperature of between about 890 degrees C and 910 degrees C for between about 29 minutes and 31 minutes.

* * * * *